(12) United States Patent
Shindo

(10) Patent No.: US 11,742,305 B2
(45) Date of Patent: Aug. 29, 2023

(54) SEMICONDUCTOR DEVICE AND MANUFACTURING METHOD OF SEMICONDUCTOR DEVICE

(71) Applicant: LAPIS Semiconductor Co., Ltd., Yokohama (JP)

(72) Inventor: Masanori Shindo, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 109 days.

(21) Appl. No.: 17/228,368

(22) Filed: Apr. 12, 2021

(65) Prior Publication Data

US 2021/0233878 A1 Jul. 29, 2021

Related U.S. Application Data

(63) Continuation of application No. 16/202,187, filed on Nov. 28, 2018, now Pat. No. 11,004,813.

(30) Foreign Application Priority Data

Nov. 29, 2017 (JP) .................................. 2017-229040

(51) Int. Cl.
*H01L 23/00* (2006.01)
*H01L 21/78* (2006.01)
(Continued)

(52) U.S. Cl.
CPC .............. *H01L 24/05* (2013.01); *H01L 21/78* (2013.01); *H01L 23/5225* (2013.01); *H01L 23/552* (2013.01); *H01L 24/03* (2013.01); *H01L 24/04* (2013.01); *H01L 24/11* (2013.01); *H01L 24/13* (2013.01); *H01L 24/94* (2013.01); *H01L 21/6836* (2013.01); *H01L 23/3114* (2013.01); *H01L 2221/6834* (2013.01); *H01L 2221/68327* (2013.01); *H01L 2224/0231* (2013.01); *H01L 2224/02379* (2013.01); *H01L 2224/0345* (2013.01); *H01L 2224/0346* (2013.01);
(Continued)

(58) Field of Classification Search
CPC ..... H01L 24/05; H01L 21/78; H01L 23/5225; H01L 23/552; H01L 24/03; H01L 24/11; H01L 24/13; H01L 24/94; H01L 23/3114; H01L 2224/0401; H01L 2924/3025
See application file for complete search history.

(56) References Cited

U.S. PATENT DOCUMENTS

2014/0252611 A1 9/2014 Chen et al.
2015/0035139 A1* 2/2015 Shih ........................ H01L 21/56
257/737

(Continued)

FOREIGN PATENT DOCUMENTS

JP 2001156209 A 6/2001

*Primary Examiner* — David Vu
*Assistant Examiner* — Brandon C Fox
(74) *Attorney, Agent, or Firm* — Rabin & Berdo, P.C.

(57) ABSTRACT

A semiconductor device includes a lower insulating layer formed on a primary surface of a semiconductor substrate; a sealing layer formed in contact with a top surface of the lower insulating layer; and a conductive member including a first conductive member formed on the sealing layer and having a first film thickness and a second conductive member formed on the sealing layer in contact with a first conductive member and having a second film thickness that is smaller than the first film thickness.

8 Claims, 17 Drawing Sheets

(51) Int. Cl.
*H01L 23/552* (2006.01)
*H01L 23/522* (2006.01)
*H01L 23/31* (2006.01)
*H01L 21/683* (2006.01)

(52) U.S. Cl.
CPC ............ *H01L 2224/0362* (2013.01); *H01L 2224/03614* (2013.01); *H01L 2224/0401* (2013.01); *H01L 2224/05024* (2013.01); *H01L 2224/05084* (2013.01); *H01L 2224/05583* (2013.01); *H01L 2224/05647* (2013.01); *H01L 2224/05655* (2013.01); *H01L 2224/05666* (2013.01); *H01L 2224/05684* (2013.01); *H01L 2224/1132* (2013.01); *H01L 2224/11334* (2013.01); *H01L 2224/11849* (2013.01); *H01L 2224/13023* (2013.01); *H01L 2224/13111* (2013.01); *H01L 2224/13139* (2013.01); *H01L 2924/1203* (2013.01); *H01L 2924/1304* (2013.01); *H01L 2924/3025* (2013.01); *H01L 2924/3511* (2013.01)

(56) References Cited

U.S. PATENT DOCUMENTS

| | | | |
|---|---|---|---|
| 2015/0041985 A1* | 2/2015 | Hsieh | H01L 24/03 257/773 |
| 2016/0284658 A1 | 9/2016 | Lu et al. | |
| 2016/0307852 A1* | 10/2016 | Shih | H01L 24/06 |
| 2018/0308778 A1* | 10/2018 | Tu | H01L 23/3135 |
| 2019/0006289 A1* | 1/2019 | Huang | H01L 24/02 |

* cited by examiner

SEMICONDUCTOR DEVICE AND MANUFACTURING METHOD OF SEMICONDUCTOR DEVICE

CROSS REFERENCE TO RELATED APPLICATIONS

This application is a continuation of U.S. application Ser. No. 16/202,187, filed on Nov. 28, 2018 (allowed on Jan. 13, 2021), which claims priority from a Japanese Patent Application No. 2017-229040 filed on Nov. 29, 2017, the contents of which are incorporated herein by reference.

TECHNICAL FIELD

The present invention relates to a semiconductor device and a manufacturing method for a semiconductor device.

BACKGROUND ARTS

Wafer level CSP (chip size package) that is of the same size as the semiconductor substrate and that connects circuit elements formed on the primary surface of the semiconductor substrate to external elements via rewiring is used as the technology of packaging an LSI chip.

As a technology to suppress leakage of electromagnetic noise from the circuit elements formed on the primary surface of the semiconductor substrate in the wafer level CSP, formation of a shield that covers the entire surface of the semiconductor substrate in which the rewiring is connected to the ground of the circuit elements is proposed (Japanese Patent Application Laid-open Publication No. 2001-156209, for example).

SUMMARY OF THE INVENTION

When the rewiring that has a large film thickness is formed on the surface of the semiconductor substrate by plating, the semiconductor substrate would warp. Also, the greater the pattern ratio of the thick wiring on the surface of the semiconductor substrate is, the greater the amount of warp in the semiconductor substrate is.

As in the conventional technology described above, if the thick rewiring is formed on the entire surface of the semiconductor substrate to form the shield to suppress the electromagnetic noise from the circuit elements, the pattern ratio of the rewiring is great, which causes the amount of warp in the semiconductor substrate to exceed the allowable level in the manufacturing process, and as a result, a manufacturing defect would occur.

For example, if the amount of warp in the semiconductor substrate exceeds the allowable level in the manufacturing process of the wafer level CSP, a suction error would occur in the vacuum chuck or electrostatic chuck for making the semiconductor substrate stick to the stage of the manufacturing equipment, which causes the process in the manufacturing equipment to stop.

In the photolithography process to form a resist pattern on the surface of the semiconductor substrate, off-focus would occur, which causes the resist pattern to have undesired dimensions. If the resist pattern cannot be formed with the desired dimensions, the dimensions of other members such as insulating members and conductive members that are formed using the resist pattern as the reference would differ from the prescribed dimensions, and as a result, the semiconductor device would not have the desired characteristics.

The present invention was made in view of the problems described above, and is aiming at providing a semiconductor device and a manufacturing method for a semiconductor device that can reduce the warp in the semiconductor substrate while suppressing the electromagnetic noise leakage and the effect of the external electromagnetic noise.

A semiconductor device of the present invention includes: a lower insulating layer formed on a primary surface of a semiconductor substrate; a sealing layer formed in contact with a top surface of the lower insulating layer; and a conductive member including a first conductive member formed on the sealing layer and having the first film thickness and a second conductive member formed on the sealing layer in contact with the first conductive member and having the second film thickness that is smaller than the first film thickness.

A semiconductor device of the present invention includes: a lower insulating layer formed on a primary surface of a semiconductor substrate; a wiring layer formed on the lower insulating layer and having the first film thickness; and a shield portion formed on the lower insulating layer to be separated from at least two sides of the wiring layer by a prescribed distance, the shield portion having the second film thickness that is smaller than the first film thickness.

A manufacturing method of a semiconductor device of the present invention includes: a step of preparing a semiconductor substrate in which an electrode is formed; a first step of forming a lower insulating layer on a primary surface of the semiconductor substrate, the lower insulating layer having an opening to expose a part of a surface of the electrode; a second step of forming an underbarrier metal (UBM) film on a surface of the lower insulating layer and the surface of the electrode that is exposed through the opening, the UBM film being made of a sealing layer and a seed layer; a third step of forming a first conductive member having a first film thickness in a region that corresponds to the opening of the lower insulating layer; a fourth step of forming a resist in a region that corresponds to a shield portion on the seed layer; and a fifth step of removing the UBM film using the resist and the first conductive member as a mask to form a barrier metal portion.

According to the semiconductor device of the present invention, it is possible to reduce the warp in the semiconductor substrate while suppressing the electromagnetic noise leakage and the effect of the external electromagnetic noise. This makes it possible to prevent defects from occurring due to the warp in the semiconductor substrate in the manufacturing process of the semiconductor device.

DETAILED DESCRIPTION OF THE INVENTION

Figure 1:
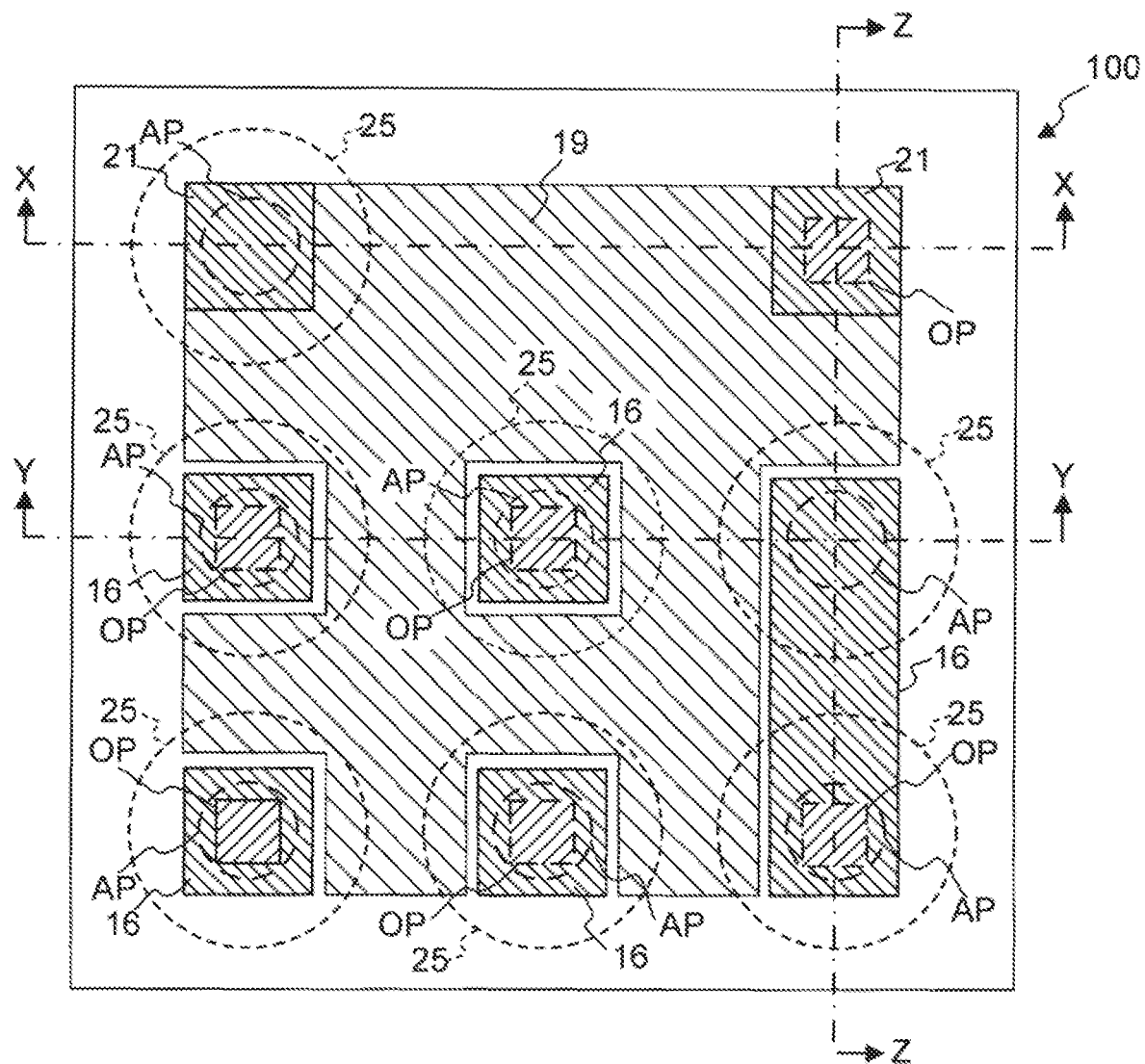
FIG. 1 is a top view showing the top surface of a semiconductor device 100.

Embodiments of the present invention will be explained below with reference to figures. In the descriptions of the embodiment below and appended figures, components and parts that are substantially the same or equivalent to each other are given the same reference characters.

Figure 2A:
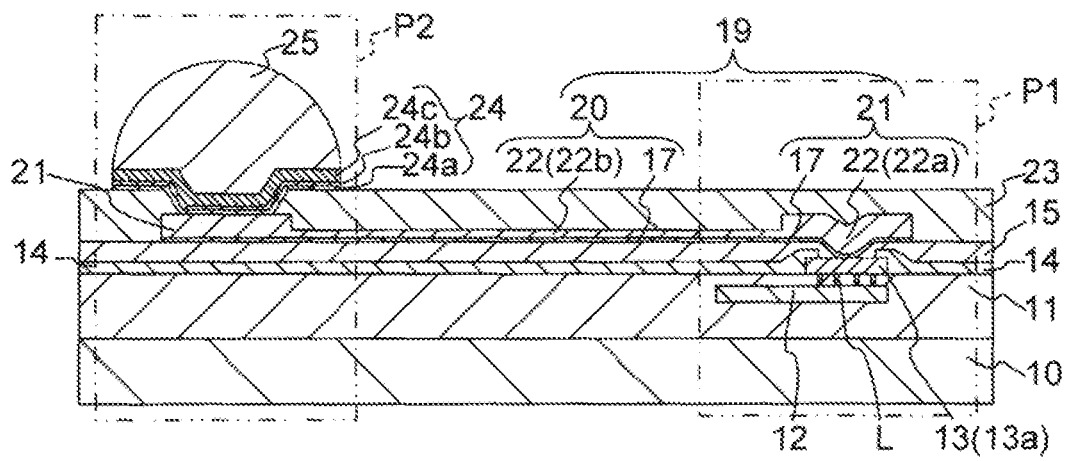
FIG. 2A is a cross-sectional view showing a cross section along the line X-X in FIG. 1.
Figure 2B:
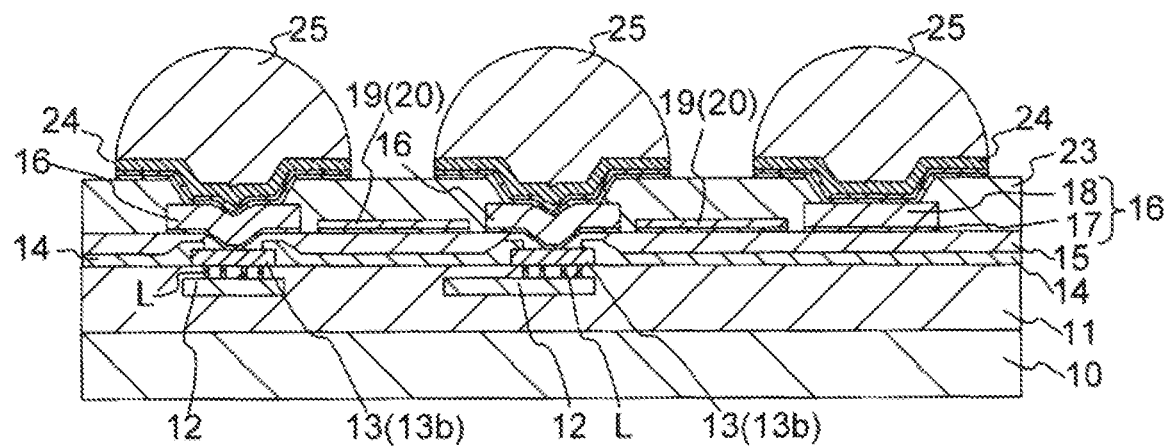
FIG. 2B is a cross-sectional view showing a cross section along the line Y-Y in FIG. 1.
Figure 2C:
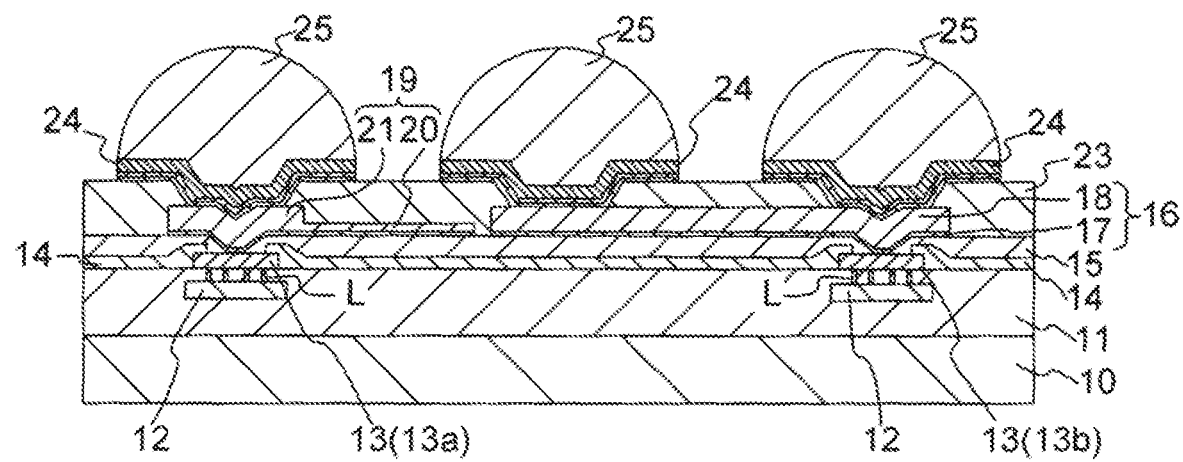
FIG. 2C is a cross-sectional view showing a cross section along the line Z-Z in FIG. 1.

FIG. 1 is a top perspective view showing a part of a semiconductor device 100 of the present invention shown from above the element forming surface. FIG. 2A is a cross-sectional view along the line X-X in FIG. 1. FIG. 2B is a cross-sectional view along the line Y-Y in FIG. 1. FIG. 2C is a cross-sectional view along the line Z-Z in FIG. 1.

The semiconductor device 100 has side walls that is cut by dicing, and has a rectangular shape in a plan view (top view) as shown in FIG. 1.

As shown in FIGS. 2A to 2C, an interlayer insulating film 11 is formed on a semiconductor substrate 10 made of Si (silicon) of the first conductivity type (such as p type). In the interlayer insulating film 11, lower layer wiring 12 is formed.

On the interlayer insulating film 11, an electrode pad 13 and a passivation film 14, which functions as a protective layer, are formed. The electrode pad 13 is connected to the lower layer wiring 12 through a connector L, and is therefore electrically connected to a circuit element (not shown in the figure) formed on the semiconductor substrate 10. The circuit element is connected to a fixed potential through the electrode pad 13, or receives and transmits a signal through the electrode pad 13. In the description below, some electrode pads 13 that are connected to the fixed potential will also be referred to as the electrode pads 13a, and other electrode pads 13 that are used for signal transmission and reception will also be referred to as the electrode pads 13b. The passivation film 14 is formed in such a way that a part of the electrode pad 13 is exposed and the outer edges and side faces of the electrode pad 13 and the interlayer insulating film 11 are covered.

On the passivation film 14, a lower insulating layer 15 is formed. The lower insulating layer 15 covers the surface of the passivation film 14, and has an opening OP (shown in FIG. 1) to expose the surface of the electrode pad 13 that is not covered by the passivation film 14. The opening OP has a slanted side wall. The lower insulating layer 15 is made of a photosensitive organic insulating film such as polyimide or PBO (Polybenzoxazole).

On the lower insulating layer 15, rewiring 16 is formed. One end of the rewiring 16 is connected to the electrode pad 13b via the opening OP of the lower insulating layer 15, and the other end thereof is connected to the external connecting terminal 25. If the external connecting terminal 25 is formed immediately above the electrode pad 13, the bottom surface of the rewiring 16 is connected to the electrode pad 13 via the opening OP of the lower insulating layer 15, and the top surface of the rewiring 16 is connected to the external connecting terminal 25. The rewiring 16 is constituted of a sealing layer 17 and a conductive layer 18.

The sealing layer 17 is made of a film having a high adhesion property with the lower insulating layer 15 such as Ti or TiW formed by spattering. The conductive layer 18 is formed on the sealing layer 17, and is made of Cu formed by plating. The sealing layer 17 is approximately 150 mm-thick, and the conductive layer 18 is approximately 5 μm-thick.

On the lower insulating layer 15, a shield 19 is formed. As shown in FIGS. 1 and 2B, the shield 19 is formed on the entire surface of the lower insulating layer 15 such that the shield 19 is separated from at least two sides of the rewiring 16 by a prescribed distance, or the shield 19 surrounds the rewiring 16 while keeping a prescribed distance from the rewiring 16. The distance between the shield 19 and the rewiring 16 is preferably 5 μm or greater, which is defined by the resolution and the overlap amount in the photolithography, but no greater than 10 μm so that leakage of the electromagnetic noise can be suppressed. This way, it is possible to reduce the leakage of electromagnetic noise caused by the circuit element and to suppress the effect of the external electromagnetic noise.

As shown in FIGS. 2A and 2C, the shield 19 is made of a shield portion 20 that is thinner than the rewiring 16, and a wiring portion 21 that has approximately the same thickness as the rewiring 16.

The wiring portion 21 is formed at the opening OP of the lower insulating layer 15 and the area P1 around the opening OP (see FIG. 2A), and at the opening AP of the upper insulating layer 23 and the area P2 around the opening AP (see FIG. 2A). The wiring portion 21 formed at the opening OP of the lower insulating layer 15 and the surrounding area P1 is formed to extend over a prescribed distance from the outer circumference of the opening OP on the top surface side of the lower insulating layer 15 and to entirely cover the opening OP in a plan view. The distance between an edge of the wiring portion 21 formed in the surrounding area P1 and the outer circumference of the opening OP on the top surface side of the lower insulating layer 15 is preferably about 2 to 5 µm, considering the variations in dimensions in the photolithography and the offset amount of the mask.

One part of the shield 19 is connected to the electrode pad 13a, and the other part of the shield 19 is connected to the external connecting terminal 25. This way, the shield 19 is connected to the ground terminal of the circuit element via the electrode pad 13a, and is also connected to the fixed potential via the external connecting terminal 25 and a mounting substrate.

The shield 19 is constituted of the sealing layer 17 and the conductive member 22. The conductive member 22 includes the first conductive portion 22a made of Cu formed by plating, and the second conductive portion 22b made of Cu formed by spattering. The first conductive portion 22a is formed to be approximately 5 µm-thick, and constitutes the wiring portion 21 together with the sealing layer 17. The second conductive portion 22b is formed to be approximately 200 to 500 nm-thick, and constitutes the shield portion 20 together with the sealing layer 17.

The upper insulating layer 23 is formed to cover the surface of the lower insulating layer 15, the rewiring 16, and the shield 19. The upper insulating layer 23 has an opening AP (shown in FIG. 1) in an area that includes the other end of the rewiring 16 and a portion of the shield 19 connected to the external connecting terminal 25. The upper insulating layer 23 is made of a photosensitive organic insulating film such as polyimide, PBO (Polybenzoxazole), or a novolak-base organic insulating film. The wiring portion 21 formed at the opening AP of the upper insulating layer 23 and in the surrounding area P2 is formed to entirely cover opening AP in a plan view, and is formed in a region that is entirely covered by the external connecting terminal 25 in a plan view. As shown in FIG. 2A, the distance between the outer edge of the wiring portion 21 and an inner circumferential edge of the opening AP on the lower surface of the upper insulating layer 23 contacting the wiring portion 21 is preferably about 2 µm, considering the variations in dimensions in the photolithography and the offset amount of the mask.

On the surface of the upper insulating layer 23, the barrier metal portion 24 is formed. The barrier metal portion 24 is to be connected to the rewiring 16 and the shield 19 via the opening AP of the upper insulating layer 23. As shown in FIG. 2A, the barrier metal portion 24 is formed by laminating an Ni layer 24c formed by plating on a multilayer film of a Ti layer 24a and a Cu layer 24b formed by spattering.

On the barrier metal portion 24, the external connecting terminal 25 is formed. The external connecting terminal 25 is connected to wiring formed on a substrate on which the semiconductor device 100 is to be mounted. In one embodiment, the external connecting terminal 25 is made of SnAg.

As described above, in the semiconductor device 100 of this embodiment, the shield 19, which includes the wiring portion 21 having a larger film thickness and formed by plating and the shield portion 20 having a smaller film thickness and formed by spattering, is formed on the entire surface of the lower insulating layer 15. The majority of the area except for the forming areas of the opening OP of the lower insulating layer 15 and the opening AP of the upper insulating layer 23 is the shield portion 20 having a smaller film thickness, and therefore, the pattern ratio of the wiring portion 21 having a larger film thickness to the surface of the semiconductor substrate is low. Thus, the amount of warp in the semiconductor substrate is smaller than the case in which the entire surface is covered by the rewiring 16 and the shield that has the same film thickness as the rewiring 16. As a result, it is possible to reduce manufacturing defects caused by the warp in the semiconductor substrate.

Figure 3:
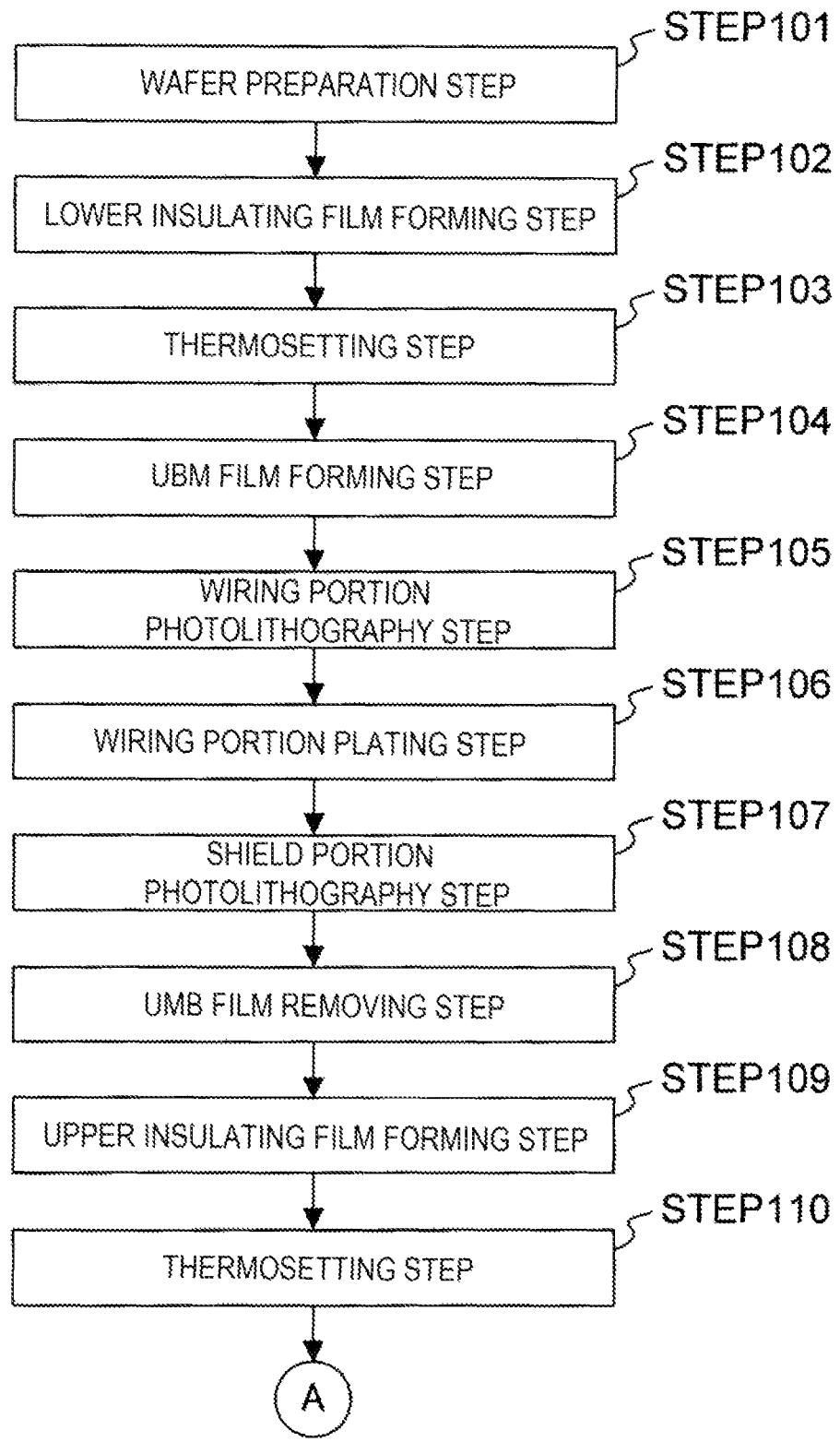
FIG. 3 is a flowchart showing the manufacturing steps of the semiconductor device 100.
Figure 4:
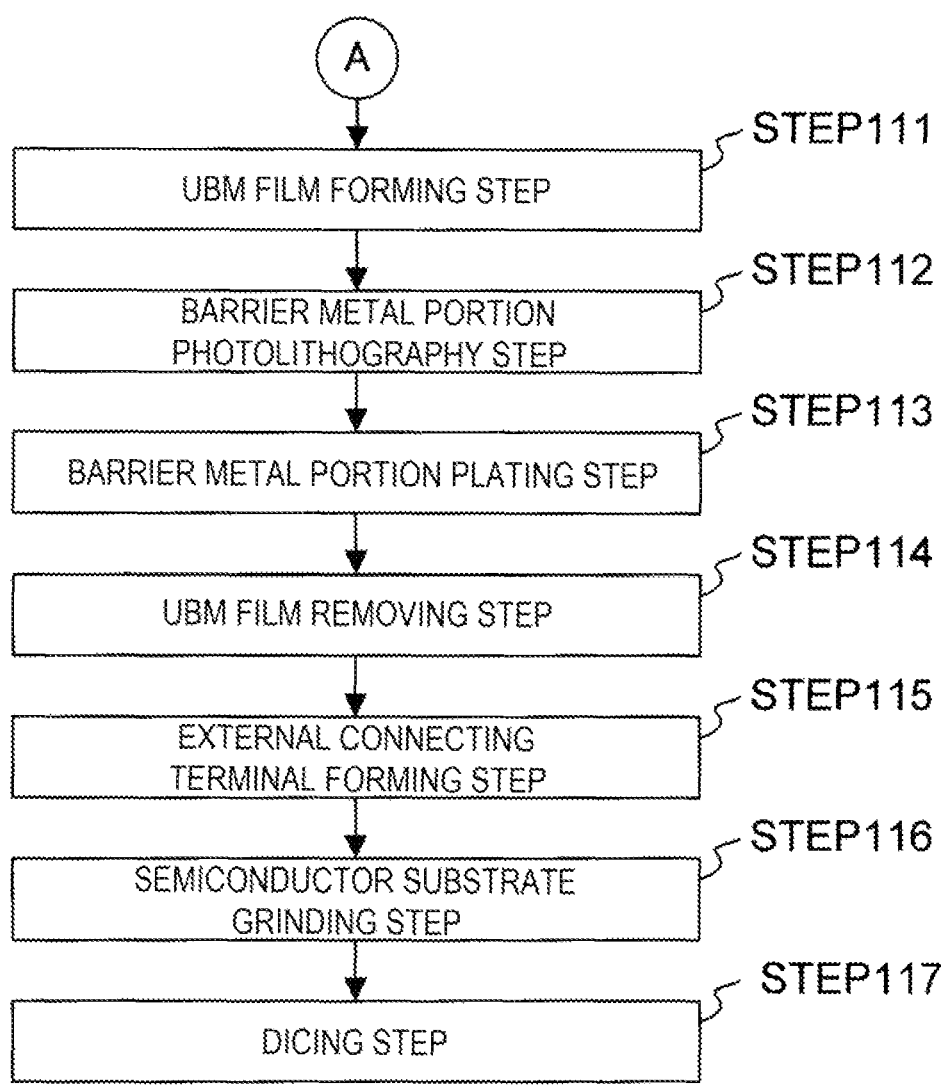
FIG. 4 is a flowchart showing the manufacturing steps of the semiconductor device 100.

Next, the manufacturing method for the semiconductor device 100 will be explained with reference to the manufacturing steps shown in FIGS. 3 and 4. The respective steps will be explained with reference to FIGS. 5A to 5D, FIGS. 6A to 6D, FIGS. 7A to 7D, and FIGS. 8A to 8C, respectively. Each diagram shows the cross-sectional view along the line Z-Z of FIG. 1 (that is FIG. 2C).

Figure 5A:
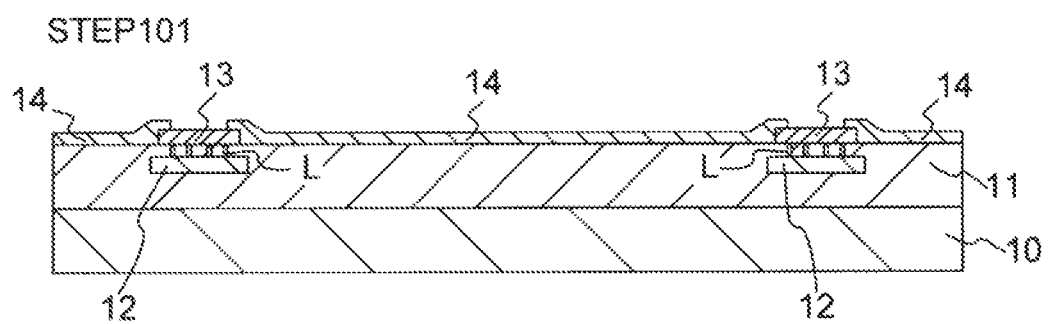
FIG. 5A is a cross-sectional view showing a cross section along the line Z-Z in the wafer preparation step.

As shown in FIG. 5A, a semiconductor wafer that includes a semiconductor substrate 10, a semiconductor element (not shown in the figure) formed on the semiconductor substrate 10, an interlayer insulating film 11 covering the semiconductor substrate 10 and the semiconductor element, an electrode pad 13 formed on the interlayer insulating film 11 and connected to the semiconductor element, and a passivation film (protection layer) 14 having an opening to expose a part of the electrode pad 13 is prepared (wafer preparation step: STEP 101). An example of a semiconductor element formed on the semiconductor substrate is an active or switchable semiconductor element, such as a transistor, or a passive semiconductor element, such as a diode.

Next, the wafer of FIG. 5A undergoes a lower insulating film forming step (STEP 102). Specifically, a lower insulating film 31 made of a photosensitive material such as polyimide or PBO is coated on the passivation film 14 and the electrode pad 13 by the spin coating method or the like. Furthermore, an opening to expose the electrode pad 13 is formed by a known photolithography technique (exposure and development). This way, as shown in FIG. 5B, the lower insulating film 31 having an opening OP1 is formed.

The photolithography technique used in the photolithography process in this lower insulating film forming step and the photolithography processes described below may be of the positive type or negative type. In the positive type photolithography, light is radiated to the entire area except for the area where the opening OP1 is to be formed, and the development process is performed, thereby forming the opening OP1.

Figure 5B:
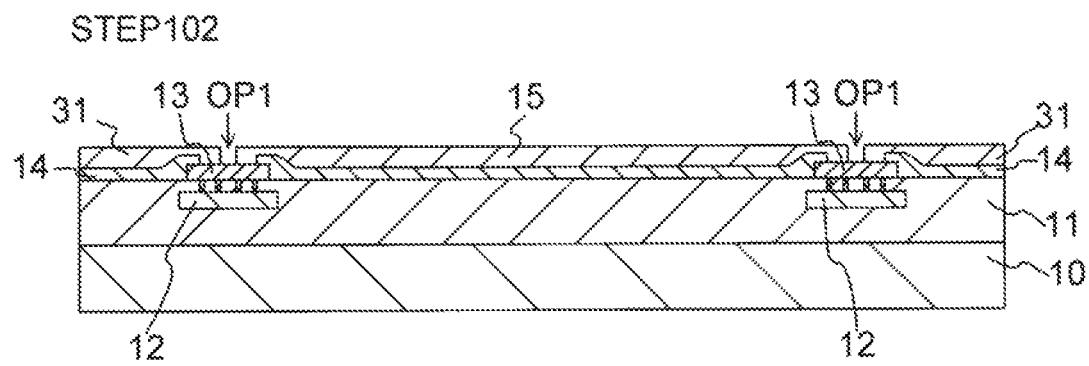
FIG. 5B is a cross-sectional view showing a cross section along the line Z-Z in the lower layer insulating film forming step.

Next, the wafer of FIG. 5B undergoes a thermosetting step (STEP 103). Specifically, by thermally curing the lower insulating film 31 in a curing furnace, a lower insulating layer 15 is formed. In this step, the side wall of the opening OP1 formed in the lower insulating film forming step of STEP 102 is changed from a vertical wall to a tapered wall due to the thermal contraction of the lower insulating film 31. This results in the lower insulating layer 15 with an opening OP2 having the outer circumference on the top surface side of the lower insulating layer 15 and the inner circumference of the bottom surface side as shown in FIG. 5C.

Figure 5C:
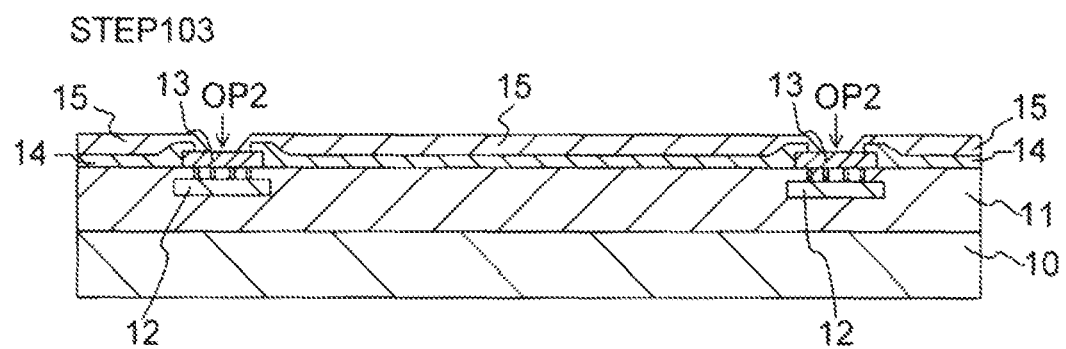
FIG. 5C is a cross-sectional view showing a cross section along the line Z-Z in the thermosetting steps.

Next, the wafer of FIG. 5C undergoes an underbarrier metal (UBM) film forming step (STEP 104). Specifically, a UBM film 32 that covers the entire surface of the lower insulating layer 15 including the side wall of the opening OP2 and the surface of the electrode pad 13 is formed. The UBM film 32 is formed by laminating Ti, which will be used for the sealing layer, and Cu, which will be used for the seed layer, by spattering. This way, as shown in FIG. 5D, the UBM film 32 made of a Ti layer 32a (sealing layer) and a Cu layer 32b (seed layer) is formed.

Figure 5D:
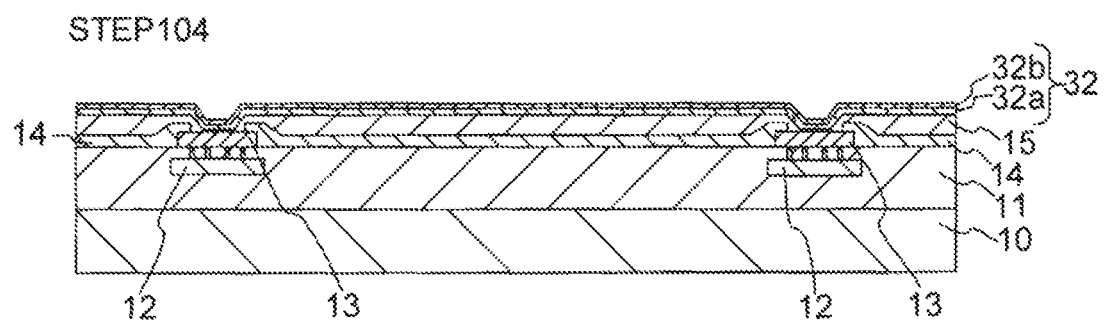
FIG. 5D is a cross-sectional view showing a cross section along the line Z-Z in the UBM film forming step.

Next, the wafer of FIG. 5D undergoes a wiring portion photolithography step (STEP 105). Specifically, a resist mask 33 having openings is formed, and through the openings, the UBM film 32 in the regions where the wiring portion 21 is to be formed is exposed. The resist mask 33 is formed by first forming a resist on the wafer by the spin coating method, and thereafter performing the exposure and development processes. This way, the resist mask 33 as shown in FIG. 6A is formed.

Figure 6A:
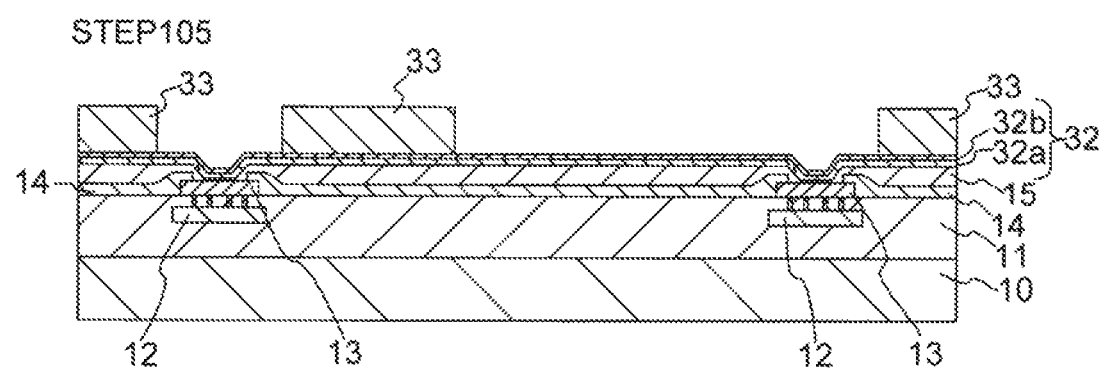
FIG. 6A is a cross-sectional view showing a cross section along the line Z-Z in the wiring photolithography step.

Next, the wafer of FIG. 6A undergoes a wiring portion plating step (STEP 106). Specifically, the surface of the wafer is immersed into a plating bath, and a voltage is applied to the UBM film, thereby depositing Cu in an area corresponding to the openings of the resist mask 33. Thereafter by performing ashing with an ashing machine or immersing the wafer into an organic removal solution, the resist is removed. This way, as shown in FIG. 6B, the conductive layer 18 and the first conductive member 22a of the conductive member 22 are formed.

Figure 6B:
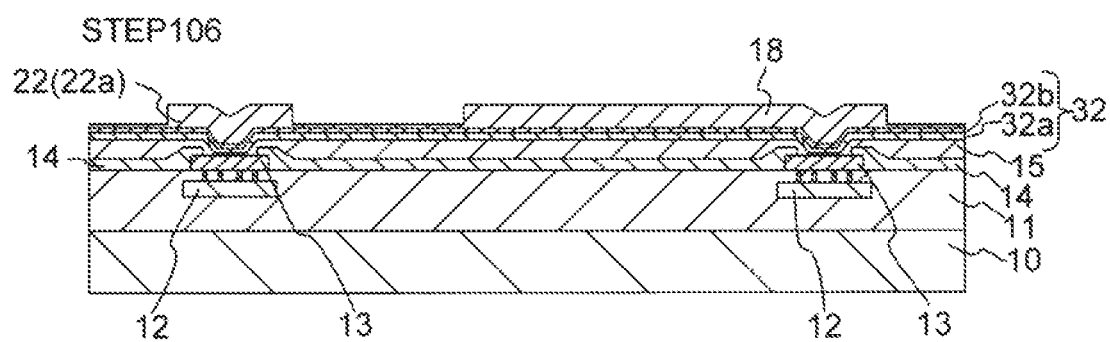
FIG. 6B is a cross-sectional view showing a cross section along the line Z-Z in the wiring plating step.

Next, the wafer of FIG. 6B undergoes a shield portion photolithography step (STEP 107). Specifically, a resist mask 34 is formed to cover the area where the shield portion 20 is formed. It is not necessary to entirely cover the first conductive member 22a of the conductive member 22 with the resist mask 34 in this step, because the resist mask 34 and the first conductive member 22a of the conductive member 22 are used for a mask in an etching process conducted in the subsequent UBM film removing step. This way, the resist mask 34 as shown in FIG. 6C is formed.

Figure 6C:
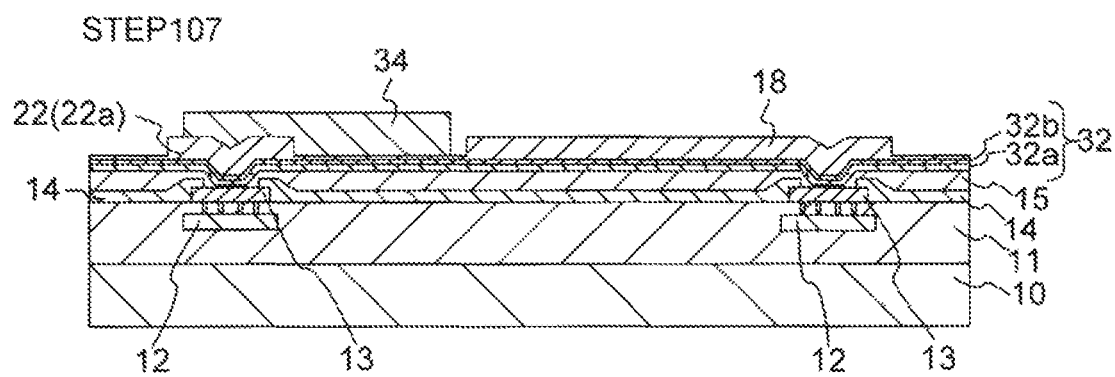
FIG. 6C is a cross-sectional view showing a cross section along the line Z-Z in the shield portion photolithography step.

Next, the wafer of FIG. 6C undergoes a UBM film removing step (STEP 108). Specifically, the Cu layer 32b and the Ti layer 32a are removed in this order by wet etching. In the etching process for the Cu layer 32b, the first conductive member 22a (Cu) of the conductive member 22 and the resist mask 34 function as the etching mask. In the etching process for the Ti layer 32a, the first conductive member 22a (Cu) of the conductive member 22 and the resist mask 34 function as the etching mask. After the UMB film 32 is removed, by performing ashing with an ashing machine or immersing the wafer into an organic removal solution, the resist mask 34 is removed. This way, as shown in FIG. 6D, the shield 19 made of the rewiring 16, the shield portion 20, and the wiring portion 21 is formed.

Figure 6D:
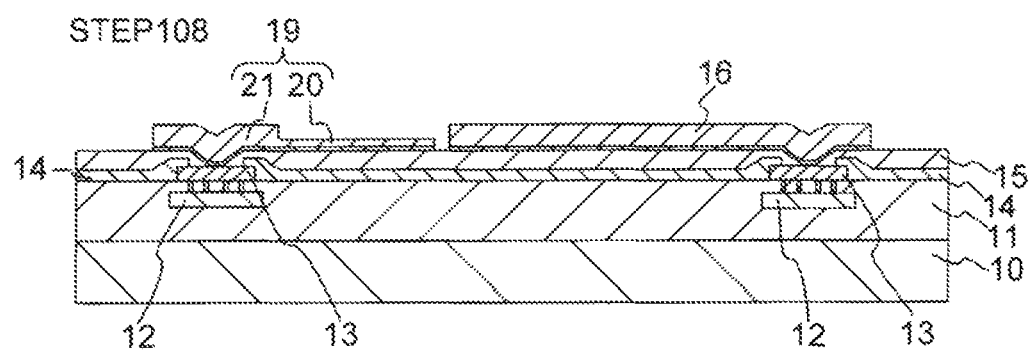
FIG. 6D is a cross-sectional view showing a cross section along the line Z-Z in the UBM film removing step.

Next, the wafer of FIG. 6D undergoes an upper insulating film forming step (STEP 109). Specifically, an upper insulating film 35 made of polyimide, PBO, or a novolak-base material is coated on the lower insulating layer 15, the rewiring 16, the wiring portion 21, and the shield portion 20 by the spin coating method or the like. Furthermore, openings to expose a part of the rewiring 16 and a part of the wiring portion 21 are formed by a known photolithography technique (exposure and development). This way, as shown in FIG. 7A, the upper insulating film 35 having the openings AP1 is formed.

Figure 7A:
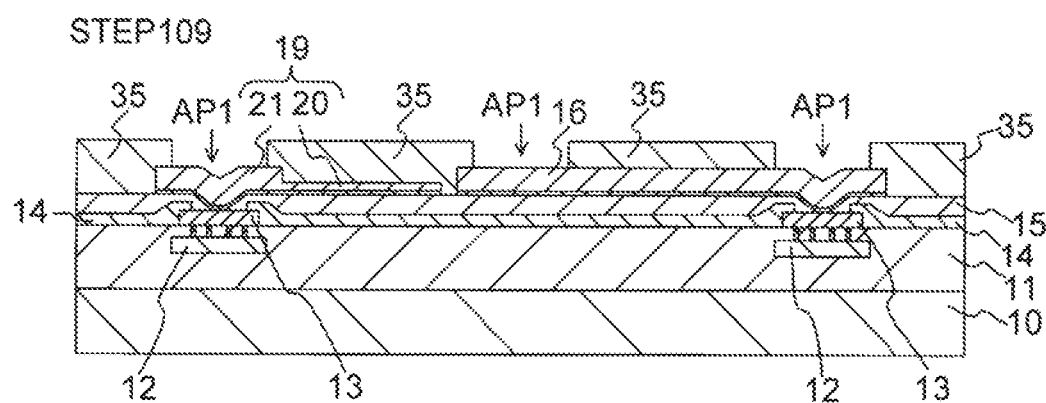
FIG. 7A is a cross-sectional view showing a cross section along the line Z-Z in the upper layer insulating film forming step.

Next, the wafer of FIG. 7A undergoes a thermosetting step (STEP 110). Specifically, by thermally curing the upper insulating film 35 in a curing furnace, an upper insulating layer 23 is formed. In this step, the side wall of each opening AP1 formed in the upper insulating film forming step of STEP 109 is changed from a vertical wall to a tapered wall due to the thermal contraction of the upper insulating film 35. This way, as shown in FIG. 7B, the upper insulating film 23 having the openings AP2 is formed.

Figure 7B:
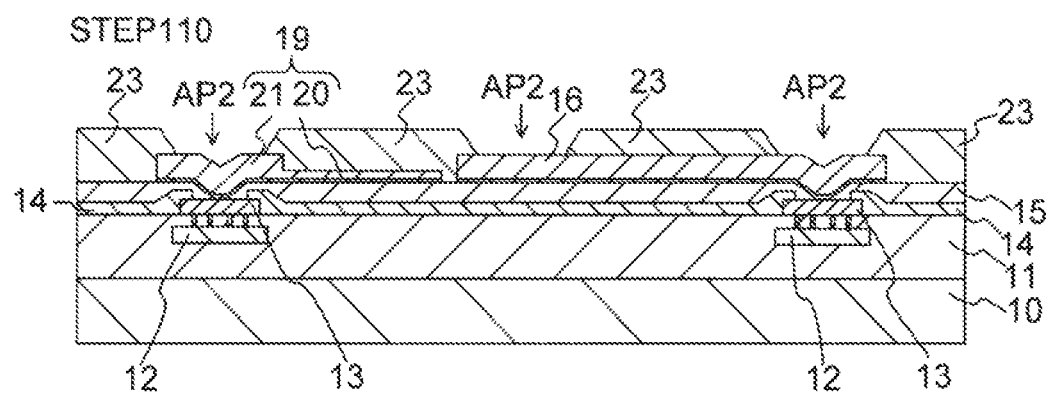
FIG. 7B is a cross-sectional view showing a cross section along the line Z-Z in the thermosetting step.

Next, the wafer of FIG. 7B undergoes a UBM film forming step (STEP 111). Specifically, an UBM film 36 is formed to cover the entire surface of the upper insulating layer 23 including the side wall of each opening AP2 and the surfaces of the rewiring 16 and the wiring portion 21 exposed through the openings AP2. The UBM film 36 is formed by laminating Ti, which will be used for the sealing layer, and Cu, which will be used for the seed layer, by spattering. This way, as shown in FIG. 7C, the UBM film 36 made of a Ti layer 36a (sealing layer) and a Cu layer 36b (seed layer) is formed.

Figure 7C:
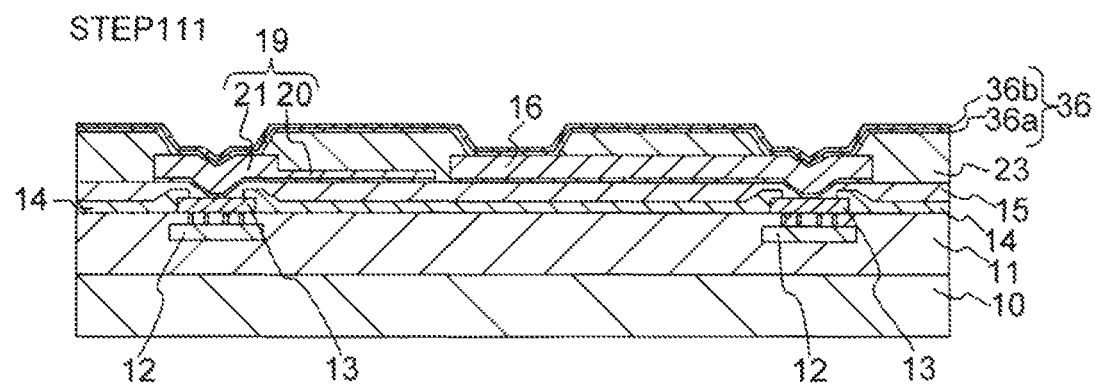
FIG. 7C is a cross-sectional view showing a cross section along the line Z-Z in the UBM film forming step.

Next, the wafer of FIG. 7C undergoes a barrier metal portion photolithography step (STEP 112). Specifically, a resist mask 37 having openings is formed, and through the openings, the UBM film 36 in the areas where the barrier metal portion 24 is to be formed is exposed. The resist mask 37 is formed by a known photolithography technique. This way, the resist mask 37 as shown in FIG. 7D is formed.

Figure 7D:
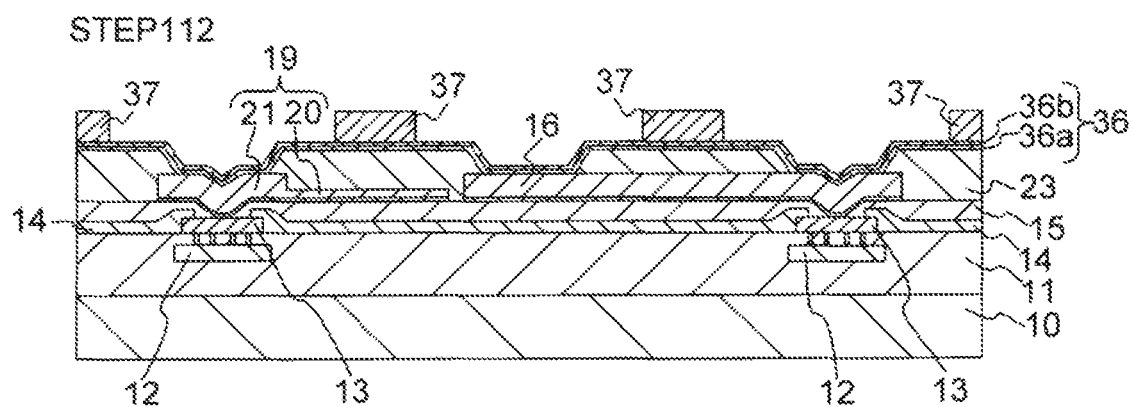
FIG. 7D is a cross-sectional view showing a cross section along the line Z-Z in the barrier metal portion photolithography step.

Next, the wafer of FIG. 7D undergoes a barrier metal portion plating step (STEP 113). Specifically, the surface of the wafer is immersed into a plating bath, and a voltage is applied to the UBM film 36, thereby depositing Ni in areas corresponding to the openings of the resist mask 37. Thereafter by performing ashing with an ashing machine or using an organic removal solution, the resist is removed. This way, an Ni layer 24c as shown in FIG. 8A is formed.

Figure 8A:
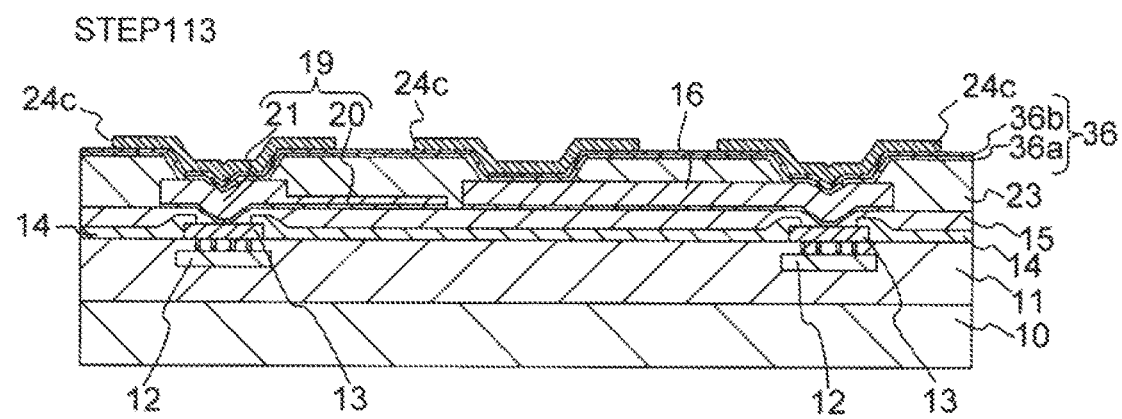
FIG. 8A is a cross-sectional view showing a cross section along the line Z-Z in the barrier metal portion plating step.

Next, the wafer of FIG. 8A undergoes a UBM film removing step (STEP 114). Specifically, the Cu layer 36b and the Ti layer 36a are removed in this order by wet etching using the Ni layer 24c as a mask. After the UMB film 36 is removed, by performing ashing with an ashing machine or immersing the wafer into an organic removal solution, the resist is removed. This way, as shown in FIG. 8B, the UBM film 36 is removed from the upper insulating layer 23, and the barrier metal portion 24 made of the Ti layer 24a, the Cu layer 24b, and the Ni layer 24c is formed.

Figure 8B:
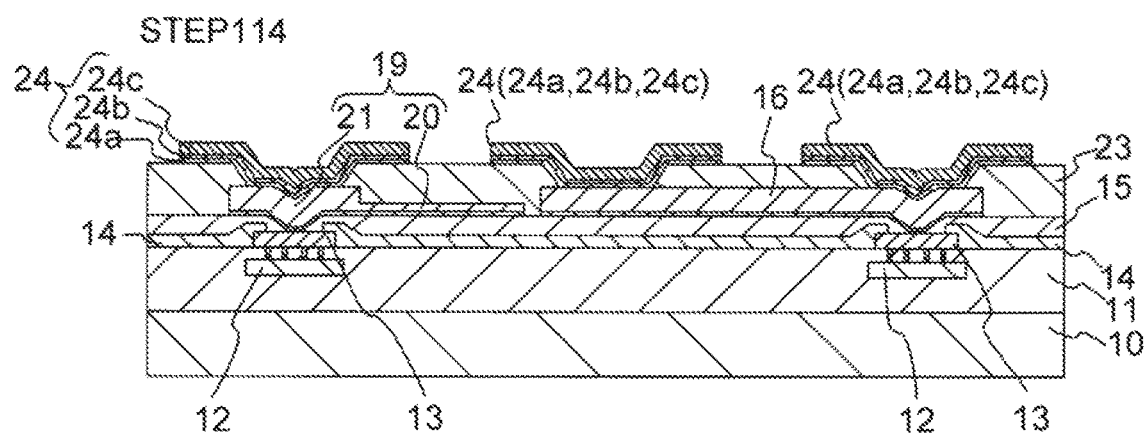
FIG. 8B is a cross-sectional view showing a cross section along the line Z-Z in the UBM film removing step.

Next, the wafer of FIG. 8B undergoes an external connecting terminal forming step (STEP 115). Specifically, first, solder terminals mainly made of Sn—Ag are formed on the barrier metal portion 24 by solder printing (silk printing) or ball mounting. After arranging the solder terminals, reflow is performed, thereby forming the external connecting terminals 25 on the barrier metal portion 24. This way, as shown in FIG. 8C, the wafer with the external connecting terminals 25 is formed.

Figure 8C:
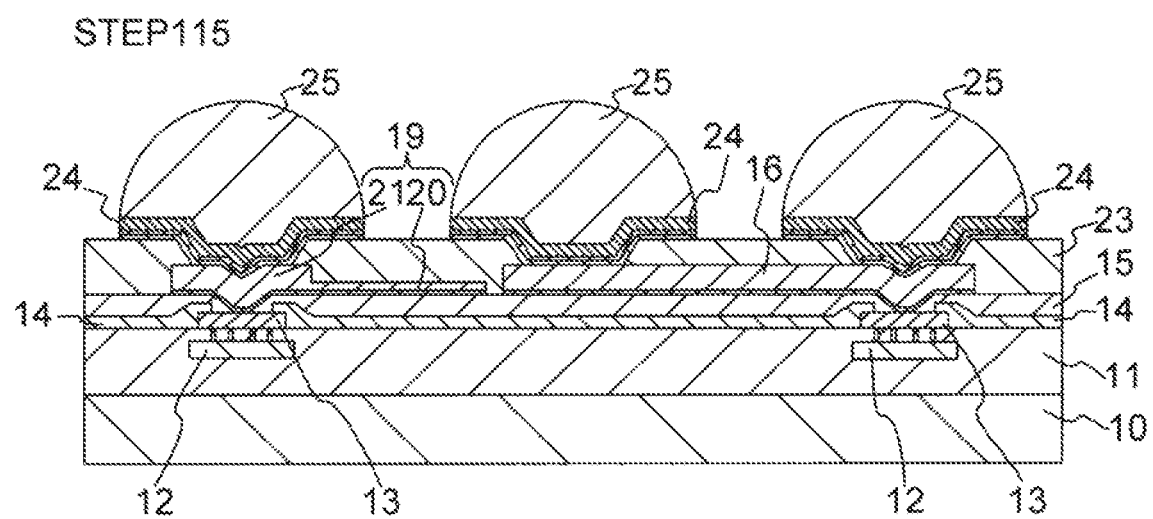
FIG. 8C is a cross-sectional view showing a cross section along the line Z-Z in the external connecting terminal forming step.

Next, the wafer of FIG. 8C undergoes a semiconductor substrate grinding step (STEP 116). Specifically, after placing a protective tape on the surface of the wafer, the rear surface of the wafer is grinded by a grinder, thereby reducing the thickness of the wafer.

Next, the thinned wafer undergoes a dicing step (STEP 117). Specifically, after removing the protective tape from the surface of the wafer, a dicing tape is placed on the rear surface of the wafer, and the wafer is cut into respective chips by a dicer.

The semiconductor device 100 is manufactured through the manufacturing process described above.

In the semiconductor device 100 of this embodiment, the shield 19, which is constituted of the wiring portion 21 having a larger film thickness and formed by plating and the shield portion 20 having a smaller film thickness and formed by spattering, is formed on the entire surface of the lower insulating layer 15. The majority of the area except for the portions to be connected to the electrode pads 13 and the external connecting terminals 25 (the forming areas of the openings OP of the lower insulating layer 15 and the openings AP of the upper insulating layer 23) is the shield portion 20 having a smaller film thickness, and therefore, the pattern ratio of the wiring portion 21 having a larger film thickness to the surface of the semiconductor substrate is low. Thus, the amount of warp in the semiconductor substrate is smaller than the case in which the entire surface is covered by the rewiring 16 and the shield that has the same film thickness as the rewiring 16.

As a result, with the semiconductor device 100 of this embodiment, the amount of warp in the semiconductor substrate is reduced, which decreases the occurrence of the manufacturing defects caused by the warp, while suppressing leakage of the electromagnetic wave from the semiconductor device 100 or the effects of the external electromagnetic waves.

In the manufacturing method of the semiconductor device 100 of this embodiment, the shield portion 20 and the electrode pad 13 exposed through the opening OP of the lower insulating layer 15 are connected through the wiring portion 21. This way, it is possible to suppress a defect that occurs in the process of connecting the shield portion 20 to the electrode pad 13 by a spattering film. Below, how such a defect occurs and how it is suppressed will be explained with reference to FIGS. 9A to 9D (comparison example) and FIGS. 10A to 10D (this embodiment).

Figure 9A:
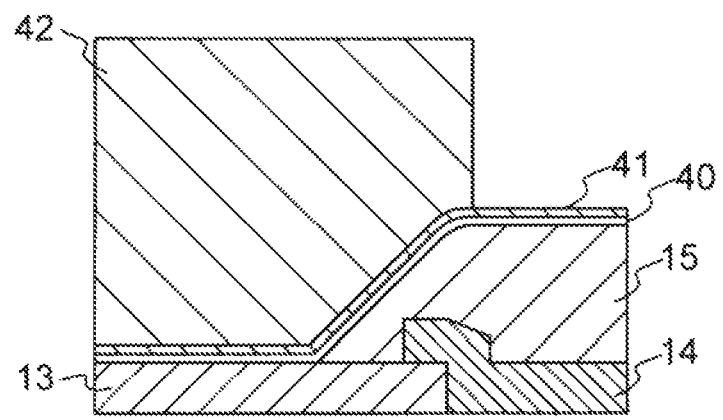
FIG. 9A is a diagram showing an etching step in the process of connecting the electrode pad to the shield portion in a comparison example.

In order to connect the electrode pad to the shield portion by a spattering film, generally, the spattering film is patterned by wet etching using a resist mask. For example, as shown in FIG. 9A, which is a comparison example, the multilayer film of the sealing layer 40 (Ti) and the conductive film 41 (Cu) formed by spattering is patterned using the resist film 42 as a mask.

Figure 9B:
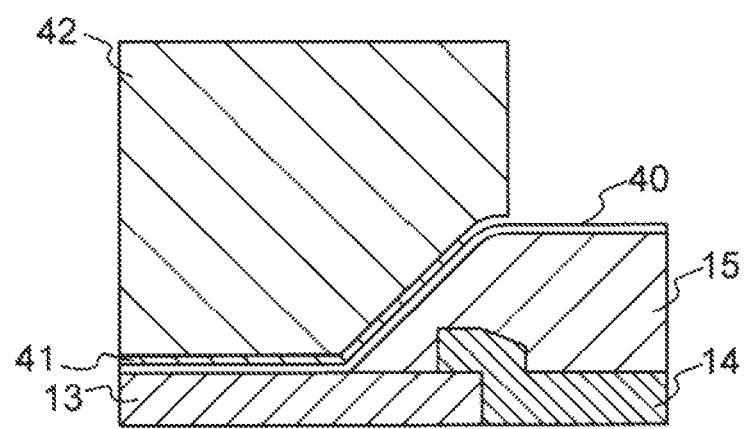
FIG. 9B is a diagram showing an etching step in the process of connecting the electrode pad to the shield portion in a comparison example.

The resist film 42 and the conductive film 41 do not adhere to each other completely, and thus, as shown in FIG. 9B, the etching of the conductive film 41 proceeds to the side wall of the opening of the lower insulating layer 15. The spattering film formed on the slanted side wall of the opening has a lower density, and therefore, the etching rate thereof is higher. For this reason, if the resist pattern gets closer to the outer circumference of the opening of the lower insulating layer 15 on the top surface side of the lower insulating layer 15 due to a reduction in a gap (clearance) between the opening and the shield portion caused by shrink, an offset error of lithography in the photolithography step, or an increase in size of the top part of the opening in the lower insulating layer 15 caused by the heat contraction of the lower insulating film in the thermosetting step, for example, the etching proceeds up to the middle point of the side wall of the opening of the lower insulating layer 15 because the conductive film 41 formed on the side wall of the opening of the lower insulating layer 15 has a higher etching rate.

Figure 9C:
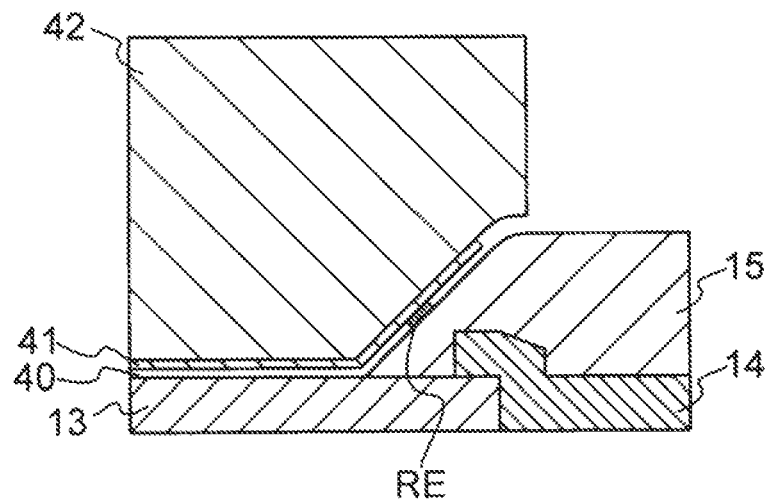
FIG. 9C is a diagram showing an etching step in the process of connecting the electrode pad to the shield portion in a comparison example.

In the subsequent etching step for the sealing layer 40, the sealing layer 40 is etched using the conductive film 41, which has been etched up to the side wall of the opening of the lower insulating layer 15. The etching of the sealing layer 40 starts from the side wall of the opening of the lower insulating layer 15, and because the spattering film formed on the side wall of the opening of the lower insulating layer 15 that is slanted has a lower density and higher etching rate as described above, the etching proceeds to a point near the electrode pad 13 exposed at the bottom of the opening as shown in FIG. 9C. Thus, the Ti etching solution for the sealing layer 40 is likely to remain in the slit between the lower insulating layer 15 and the conductive film 41.

Figure 9D:
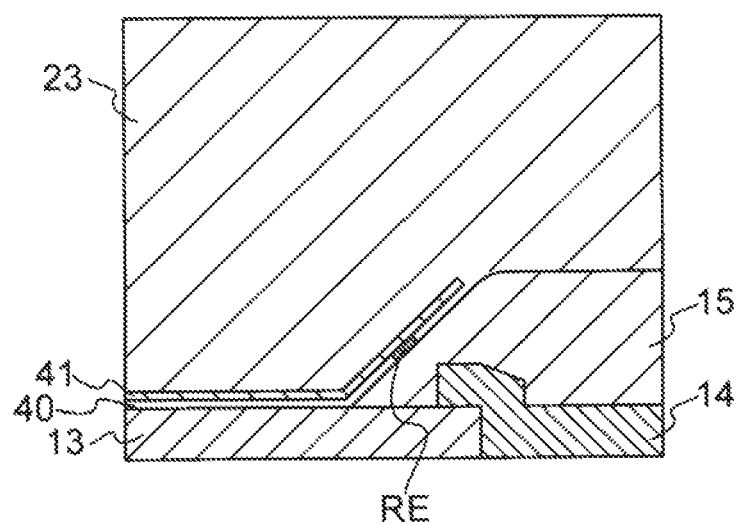
FIG. 9D is a diagram showing an etching step in the process of connecting the electrode pad to the shield portion in a comparison example.

The etching solution RE left in the slit between the conductive film 41 and the lower insulating layer 15 remains inside of the semiconductor device as shown in FIG. 9D because of the formation of the upper insulating layer 23. This remaining etching solution RE gradually corrodes the sealing layer 40 between the electrode pad 13 and the conductive film 41, and could cause disconnection between the electrode pad 13 and the conductive film 41 if use for a long time.

Figure 10A:
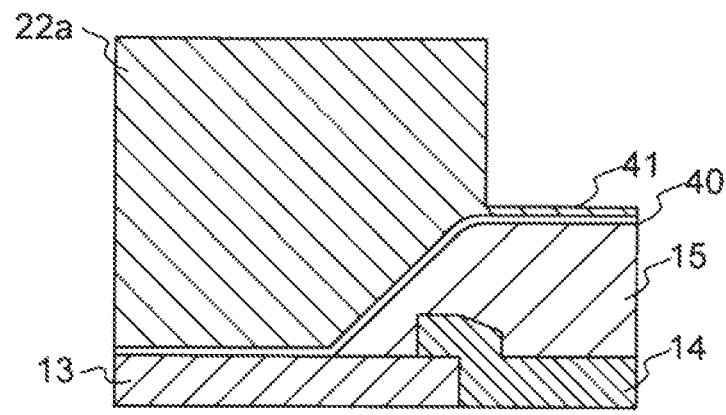
FIG. 10A is a diagram showing an etching step in the process of connecting the electrode pad to the shield portion in this embodiment.
Figure 10B:
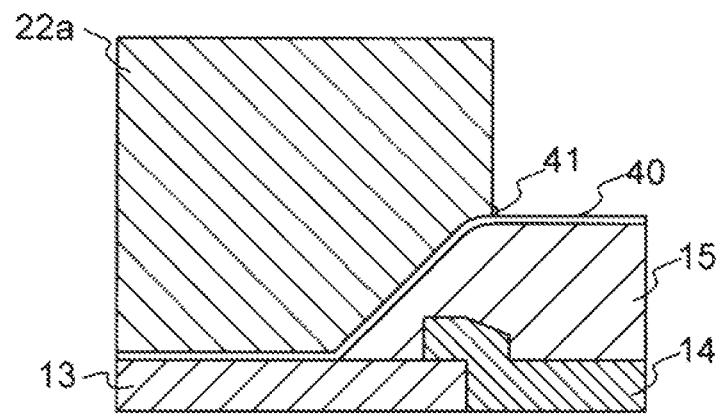
FIG. 10B is a diagram showing an etching step in the process of connecting the electrode pad to the shield portion in this embodiment.

On the other hand, in the manufacturing method of the semiconductor device 100 of this embodiment, as shown in FIG. 10A, the first conductive member 22a of the conductive member 22 formed by plating functions as the mask for the conductive film 41. When the first conductive member 22a of the conductive member 22 is formed by plating using the conductive film 41 as a seed layer, the conductive film 41 formed on the side wall of the opening of the lower insulating layer 15 is taken in by the first conductive member 22a of the conductive member 22. The density of the conductive film 41 taken in by the first conductive member 22a of the conductive member 22 is the same as the density of the plating film, and the etching rate thereof is approximately 1/10 of the conductive film 41 formed by spattering. Therefore, even if the end portion of the wiring portion 21 gets closer to the outer circumference of the opening of the lower insulating layer 15 on the top surface side of the lower insulating layer 15, the first conductive member 22a of the conductive member 22 is not susceptible to the side etching due to the etching step, and as shown in FIG. 10B, the etching of the conductive film 41 formed by spattering starts at the top surface of the lower insulating layer 15 and does not reach the side wall of the opening.

Figure 10C:
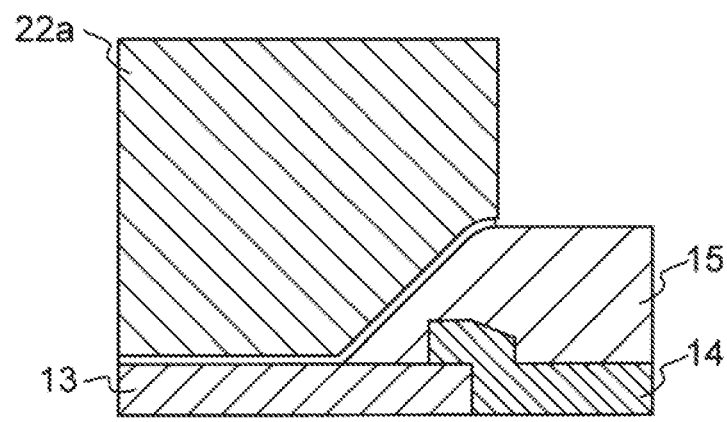
FIG. 10C is a diagram showing an etching step in the process of connecting the electrode pad to the shield portion in this embodiment.
Figure 10D:
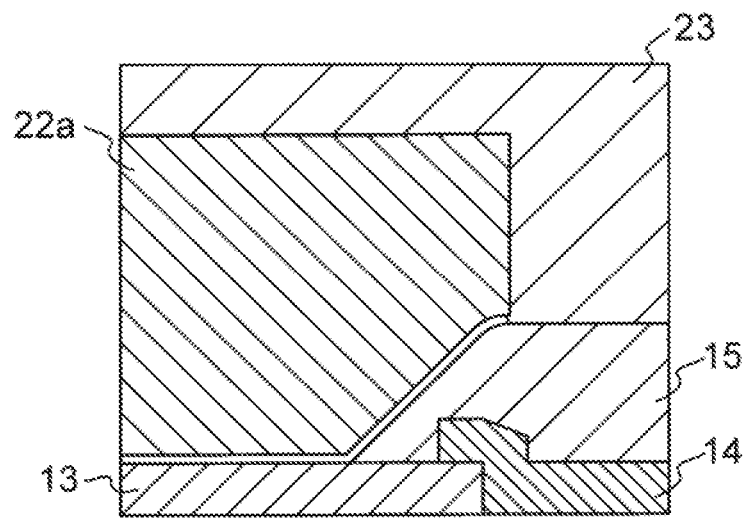
FIG. 10D is a diagram showing an etching step in the process of connecting the electrode pad to the shield portion in this embodiment.

As shown in FIG. 10C, in the etching step on the sealing layer 40, the first conductive member 22a of the conductive member 22 on the surface of the opening is used as a mask. Thus, the etching of the sealing layer 40 does not proceed to a portion with a higher etching rate, which is formed in the side wall of the opening. As shown in FIG. 10D, no slit is formed between the lower insulating layer 15 and the first conductive member 22a of the conductive member 22, and therefore, the etching solution is not left in the semiconductor device, and no connection defect would occur even with the long-term use.

In the semiconductor device 100 of this embodiment, areas exposed through the openings AP of the upper insulating layer 23 are respective parts of the wiring portion 21. This makes it possible to reduce the number of opening defects that occur in the process of forming the openings AP in the upper insulating layer 23. Explained below is how such opening defects are suppressed.

The upper insulating layer is generally made of a photosensitive organic insulating film. If a negative-type photosensitive organic insulating film is used for the upper insulating film, and if areas exposed through the openings of the upper insulating layer are those of a spattering film, the exposure process would require a longer time because the film thickness of the upper insulating film that is subjected to the exposure process is greater than the case in which the exposed areas are the wiring portion. If the exposure was insufficient, a part of the organic insulating film would remain at the bottom of each opening after the development process following the exposure process.

On the other hand, if a positive-type photosensitive organic insulating film is used for the upper insulating film, and if areas exposed through the openings of the upper insulating layer are those of a spattering film, the development process would require a longer time because the film thickness of the upper insulating film that is to be removed by the development is greater than the case in which the exposed areas are the wiring portion. If the development time was too short, a part of the organic insulating film would remain at the bottom of each opening.

This remaining part of the organic insulating film hiders the electrical connection between the external connecting terminal formed on the upper insulating layer and the shield portion, which would cause erroneous operation of the semiconductor device. In order to eliminate the film residue, the exposure process or the development process needs to be sufficiently long, but the excessive amount of exposure or development time would cause defects such as the dimensions of the opening being too large, or the shape of the opening being abnormal.

On the other hand, in the semiconductor device 100 of this embodiment, the areas exposed through the openings AP of the upper insulating layer 23 are the wiring portion, and therefore, the exposure amount or the development time does not need to be great. Thus, defects caused by the residue of the organic insulating film, such as erroneous operation of the semiconductor device, or dimensional error and abnormal shape of the opening, would not occur.

The present invention is not limited to the respective embodiments above. For example, in this embodiment, the barrier metal portion 24 was a multilayer film made of Ti/Cu/Ni, but the present invention is not limited to this, and the barrier metal portion 24 may be a multilayer film of Ti/Ni, TiW/Cu/Ni, TiW/Ni, or the like. That is, the barrier metal portion 24 may have any configuration as long as it includes a sealing layer made of Ti or TiW, and Ni.

In this embodiment, a photosensitive organic insulating film was used as an example, but the present invention is not limited to this, and it is possible to use a non-photosensitive organic insulating film for the lower insulating layer 15 and the upper insulating layer 23. In this case, the openings OP2 and AP2 are formed by the thermosetting step after the openings OP1 and AP1 are formed by etching.

DESCRIPTIONS OF THE REFERENCE CHARACTERS

100 Semiconductor device
10 Semiconductor substrate
11 Interlayer insulating film
12 Lower layer wiring
13 Electrode pad
14 Passivation film
15 Lower insulating layer
16 Rewiring
17 Sealing layer
18 Conductive layer
19 Shield
20 Shield portion
21 Wiring portion
22 Conductive member
22a First conductive member
22b Second conductive member
23 Upper insulating layer
24 Barrier metal portion
24a Ti layer
24b Cu layer
24c Ni layer
25 External connecting terminal
31 Lower insulating film
32 UMB film
32a Ti layer
32b Cu layer
33 Resist mask
34 Resist mask
35 Upper insulating film
36 UMB film
36a Ti layer
36b Cu layer
37 Resist mask
40 Sealing layer
41 Conductive film
42 Resist film
OP, AP Opening

What is claimed is:

1. A semiconductor device, comprising:
   a lower insulating layer formed on a primary surface of a semiconductor substrate;
   a sealing layer formed in contact with a top surface of the lower insulating layer; and
   a conductive member including
      a first conductive member formed on the sealing layer and having a first film thickness and
      a second conductive member formed on the sealing layer in contact with the first conductive member and having a second film thickness that is smaller than the first film thickness; and
   a wiring layer including the sealing layer and a conductive layer, the wiring layer having the first film thickness and being formed on the top surface of the lower insulating layer,
   wherein the second conductive member and a portion of the sealing layer corresponding to the second conductive member extend over the top surface of the lower insulating layer and are positioned in close vicinity of at least two sides of the wiring layer, but are separated from the at least two sides of the wiring layer by a prescribed distance.

2. The semiconductor device according to claim 1, wherein the second conductive member and the portion of the sealing layer corresponding to the second conductive member surround the wiring layer at the prescribed distance from the wiring layer.

3. The semiconductor device according to claim 1, wherein
   the lower insulating layer is formed such that a bottom surface of the lower insulating layer, opposite to the top surface, is in contact with a surface of an electrode, and
   the lower insulating layer has a first opening that exposes a part of the surface of the electrode, the first opening having an outer circumference on a side of the top surface, an inner circumference on a side of the bottom surface, and a tapered side wall connecting the outer circumference and the inner circumference,
   wherein the sealing layer extends over the top surface of the lower insulating layer, the side wall of the first opening, and the part of the surface of the electrode exposed through the first opening, and
   wherein the first conductive member is connected to the electrode through the first opening, and a region of the first conductive member corresponding to the top surface of the lower insulating layer in a plan view entirely covers the outer circumference of the first opening.

4. The semiconductor device according to claim 1, further comprising:

an upper insulating layer formed on the conductive member and having a second opening that exposes a part of a surface of the first conductive member; and an external connecting terminal formed on a surface of the upper insulating layer and connected to the first conductive member through the second opening.

5. The semiconductor device according to claim 4, wherein a region of the external connecting terminal that corresponds to the surface of the upper insulating layer in a plan view entirely covers a region of the first conductive member that corresponds to the surface of the upper insulating layer.

6. The semiconductor device according to claim 1, wherein the conductive member includes a first part of the first conductive member and a second part of the first conductive member that is separated from the first part of the first conductive member, the second conductive member being in contact with the first part of the first conductive member and the second part of the first conductive member, wherein the first part of the first conductive member is connected to an electrode through an opening of the lower insulating layer, and wherein the second part of the first conductive member is connected to an external connecting terminal.

7. The semiconductor device according to claim 4, wherein the conductive member is connected to a fixed potential via the external connecting terminal.

8. The semiconductor device according to claim 1, wherein the first conductive member is formed by plating, and the second conductive member is formed by spattering.

* * * * *